(12) United States Patent
Kiyoshi et al.

(10) Patent No.: US 7,095,246 B2
(45) Date of Patent: Aug. 22, 2006

(54) VARIABLE IMPEDANCE OUTPUT BUFFER

(75) Inventors: Kase Kiyoshi, Austin, TX (US); May Len, Cedar Park, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 10/926,121

(22) Filed: Aug. 25, 2004

(65) Prior Publication Data

US 2006/0044006 A1    Mar. 2, 2006

(51) Int. Cl.
*H03K 17/16* (2006.01)
*H03K 19/03* (2006.01)
*H03K 19/0175* (2006.01)
*H03K 19/094* (2006.01)

(52) U.S. Cl. .................. 326/30; 326/31; 326/32; 326/33; 326/34; 326/82; 326/83; 326/85; 326/86; 326/87

(58) Field of Classification Search ........... 326/30–34, 326/82, 83, 85–87
See application file for complete search history.

(56) References Cited

U.S. PATENT DOCUMENTS

| | | | | |
|---|---|---|---|---|
| 4,918,336 A | * | 4/1990 | Graham et al. | 326/117 |
| 5,015,880 A | * | 5/1991 | Drake et al. | 326/33 |
| 6,362,655 B1 | | 3/2002 | Abraham | |
| 6,560,290 B1 | | 5/2003 | Ahn | |
| 6,664,821 B1 | | 12/2003 | De Haas | |
| 6,737,886 B1 | | 5/2004 | Curatolo | |
| 6,753,738 B1 | | 6/2004 | Baird | |
| 6,836,173 B1 | * | 12/2004 | Yang | 327/390 |
| 6,903,588 B1 | * | 6/2005 | Vorenkamp | 327/170 |

* cited by examiner

*Primary Examiner*—Rexford Barnie
*Assistant Examiner*—Dylan White
(74) *Attorney, Agent, or Firm*—Daniel D. Hill

(57) ABSTRACT

An output buffer circuit (10, 40, 50) includes an output driver transistor (12), a predriver circuit (14, 54), and a bias generator (16, 54). The predriver circuit (14, 54) has an input terminal for receiving an input signal (IN), a first terminal coupled to a power supply voltage terminal, a second terminal, and an output terminal coupled to the control electrode of the transistor (12). The bias generator (16, 54) is coupled to the second terminal of the predriver circuit (14, 54), and provides a bias voltage ($V_G$) to the second terminal of the predriver circuit (14, 54) for controlling the gate voltage of the output driver transistor (12).

16 Claims, 2 Drawing Sheets

VARIABLE IMPEDANCE OUTPUT BUFFER

FIELD OF THE INVENTION

This invention relates to output buffers, and more particularly to an output buffer having variable output impedance.

BACKGROUND OF THE INVENTION

In integrated circuits, such as microprocessors, memories, and the like, signals may be routed for relatively long distances using transmission lines. A transmission line may be a bus, a printed circuit board trace, or other type of relatively long metal line for transporting a digital signal. Typically, a printed circuit board trace has a characteristic impedance of between 50 and 75 ohms. A driver circuit is used to provide enough current to "drive" a signal the length of the transmission line. A CMOS driver circuit commonly includes a P-channel transistor and an N-channel transistor connected in series between a positive power supply voltage terminal and a ground terminal. The gates of the transistors receive an input signal, and an output terminal of the driver circuit is located between the transistors. The P-channel transistor functions as a "pull-up" transistor, and the N-channel transistor functions as a "pull-down" transistor. The output impedance of the driver circuit should match the characteristic impedance of the transmission line in order for the driver circuit to absorb the reflected signal and prevent "ringing". Ringing is the repeated overshooting and/or undershooting of the signal. Ringing can cause reduced noise immunity and increased time for the signal to become, and remain, valid at the far end. Impedance matching is the practice of matching the impedance of the driver and/or the load to the characteristic impedance of the transmission line to facilitate the most efficient transfer of power. Impedance matching results in quieter waveforms, better noise immunity, and improved signal timing margin.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides an output buffer circuit having a bias generator circuit for biasing the gate of an output transistor to match an impedance of a transmission line. The bias generator circuit includes a resistance-to-voltage converter for tracking a predetermined characteristic of the output driver transistor. For example, the bias generator circuit of the illustrated embodiments tracks the drain-source voltage ($V_{DS}$) of the output driver transistor. To track the $V_{DS}$, the resistance-to-voltage converter includes a transistor that is a scaled replica of the driver transistor. The scaled output impedance of the scaled replica is used to control the output impedance of the driver transistor at a predetermined $V_{DS}$ of the driver transistor. The bias circuit also minimizes the effect of variations in process, temperature and power supply voltage because the effects are matched and compensated for by the scaled transistor.

Figure 1:
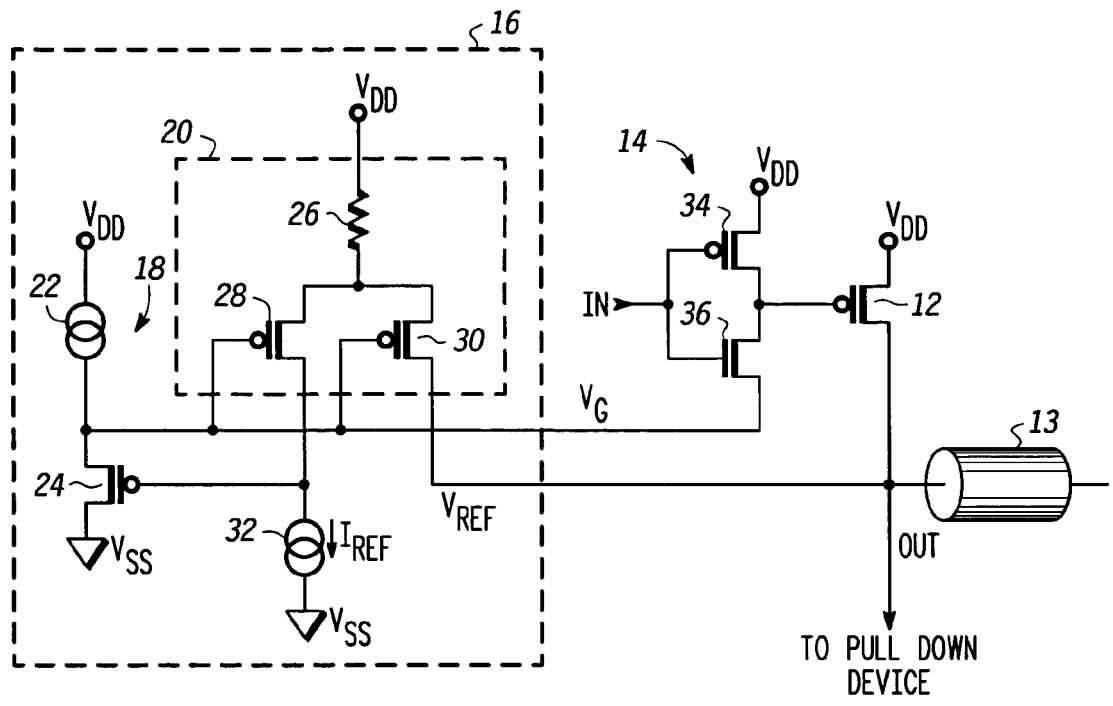
FIG. 1 illustrates, in schematic diagram form, an output buffer circuit in accordance with one embodiment of the present invention.

FIG. 1 illustrates, in schematic diagram form, an output buffer circuit 10 in accordance with one embodiment of the present invention. The output buffer circuit 10 includes an output driver transistor 12, a predriver circuit 14, and a bias generator circuit 16. The predriver circuit 14 includes transistors 34 and 36. The bias generator circuit 16 includes an amplifier 18, a resistance-to-voltage converter circuit 20, and a current source 32. The amplifier 18 includes a current source 22 and a transistor 24. The resistance-to-voltage converter circuit 20 includes resistor 26, and transistor 28 and 30. Note that in the illustrated embodiment, the output buffer circuit 10 is implemented on an integrated circuit with other circuitry (not shown). Transistors 12, 24, 28, 30, and 34 are P-type conductivity (P-channel) MOS (metal oxide semiconductor) transistors, and transistor 36 is an N-type conductivity (N-channel) MOS transistor. In other embodiments the conductivity type of the transistors and/or the type of transistor may be different.

The output driver transistor 12 has a source coupled to a power supply voltage terminal labeled "VDD", a gate, and a drain for providing an output signal labeled "OUT" to a transmission line 13. In accordance with a conventional output driver, the output driver transistor 12 is for pulling up the output signal OUT. There will also be a device coupled to transmission line 13 for pulling down the output signal OUT (not shown). The device may include one of, for example, an N-channel transistor, a bipolar transistor, a resistor, etc. The transmission line 13 may comprise a trace on a printed circuit board, a wire, or other form of conductor.

In the illustrated embodiment, predriver circuit 14 is an inverter circuit. The P-channel transistor 34 of predriver circuit 14 has a source coupled to VDD, a gate for receiving an input signal labeled "IN", and a drain coupled to the gate of output driver transistor 12. The N-channel transistor 36 has a drain coupled to the drain of transistor 34, a gate coupled to receive the input signal IN, and a source. Note that in the illustrated embodiment, both of the transistors 34 and 36 receive the same input signal. However, in other embodiments, the transistor 36 may receive a delayed version of input signal IN to prevent a current, sometimes called a "crow-bar" current, in predriver circuit 14 that is caused when both transistors 34 and 36 are conductive at the same time.

In the resistance-to-voltage converter 20, the resistor 26 has a first terminal coupled to VDD, and a second terminal. P-channel transistor 28 has a source coupled to the second terminal of the resistor 26, a gate coupled to the source of N-channel transistor 36, and a drain. P-channel transistor 30 has a source coupled to the second terminal of the resistor 26, a gate coupled to the source of N-channel transistor 36, and a drain coupled to the drain of output driver transistor 12 for receiving a feedback voltage labeled "$V_{REF}$". Note that in FIG. 1, $V_{REF}$ is substantially the same as the output signal OUT. The current source 32 has a first terminal coupled to the drain of P-channel transistor 28, and a second terminal coupled to VSS.

In the amplifier circuit 18, the current source 22 has a first terminal coupled to VDD, and a second terminal coupled to the source of transistor 36. The P-channel transistor 24 has a source coupled to the source of N-channel transistor 36 of the predriver circuit 14, a gate coupled to the drain of transistor 28, and a drain coupled to a power supply voltage terminal labeled "VSS". In the illustrated embodiment, the amplifier 18 is a unity gain amplifier.

In operation, the input signal IN is generated by internal circuitry (not shown) and applied to the input of the predriver circuit 14. The output of the predriver circuit 14 controls the gate of the pull-up output driver transistor 12. As noted above, the predriver circuit 14 comprises an inverter function. Therefore, as the output voltage of the predriver circuit 14 decreases, the conductivity of output driver transistor 12 increases causing the voltage of output signal OUT to increase. The output signal OUT is fed back to the drain of transistor 30 and used as a reference voltage ($V_{REF}$). The reference voltage $V_{REF}$ increases causing the current through transistor 30 to decrease. The current through transistor 28 increases while the current $I_{REF}$ through current source 32 remains constant, causing the gate bias to transistor 24 to increase and making transistor 24 less conductive. As the conductivity of transistor 24 decreases, the voltage $V_G$ provided to the source of transistor 36 will increase. Because $V_G$ is the lowest voltage predriver circuit 14 can drive the gate of transistor 12, when voltage $V_G$ is higher, the conductivity of the main driver is reduced. When voltage $V_G$ is lowered, the conductivity of the output driver transistor 12 is increased. Transistor 30 is a substantially scaled replica of transistor 12 and the scaled output impedance of output driver transistor 12 can be obtained at a predetermined $V_{DS}$. Note that the term "scaled replica" is used to indicate that the transistor 30 is designed to be identical to the output driver transistor 12 except that the transistor 30 is smaller by a predetermined scale factor. Therefore, the operating point of transistor 30 is set by the $V_{DS}$ and $I_D$ of transistor 12. The $V_{DS}$ and $I_D$ of output driver transistor 12 are chosen to provide the desired output impedance to dynamically match the impedance of transmission line 13 according to the following equation:

$$G_{DS12} \approx \alpha (W/L)_{12}/(W/L)_{30} \times I_{REF}$$

where $G_{DS12}$ is the drain-to-source conductance of transistor 12, $(W/L)_{12}$ is the width-to-length ratio of transistor 12, $\alpha$ is a conversion constant, and $(W/L)_{30}$ is the width-to-length ratio of transistor 30. To derive the above equation it was assumed that the voltage $V_{REF}$ is substantially equal to the voltage OUT. Because transistor 12 operates in the linear region, its ability to drive a load will be less than if it is operated in the saturation region. To compensate, transistor 12 should be sized relatively larger.

Amplifier 18 has unity gain and functions to reduce the impedance at the source of transistor 36. This lets the voltage $V_G$ swing more freely and gives the output driver transistor 12 relatively faster operation. Amplifier 18 is optional, as will be seen below in the embodiment of FIG. 3.

Using a feedback signal to provide $V_{REF}$ provides impedance matching for a relatively wide voltage range. However, the presence of the feedback path results in a relatively slower output buffer. Also, the bias generator 16 can dynamically adjust the voltage $V_G$ to compensate for changes in power supply voltage, temperature, and the manufacturing process.

Figure 2:
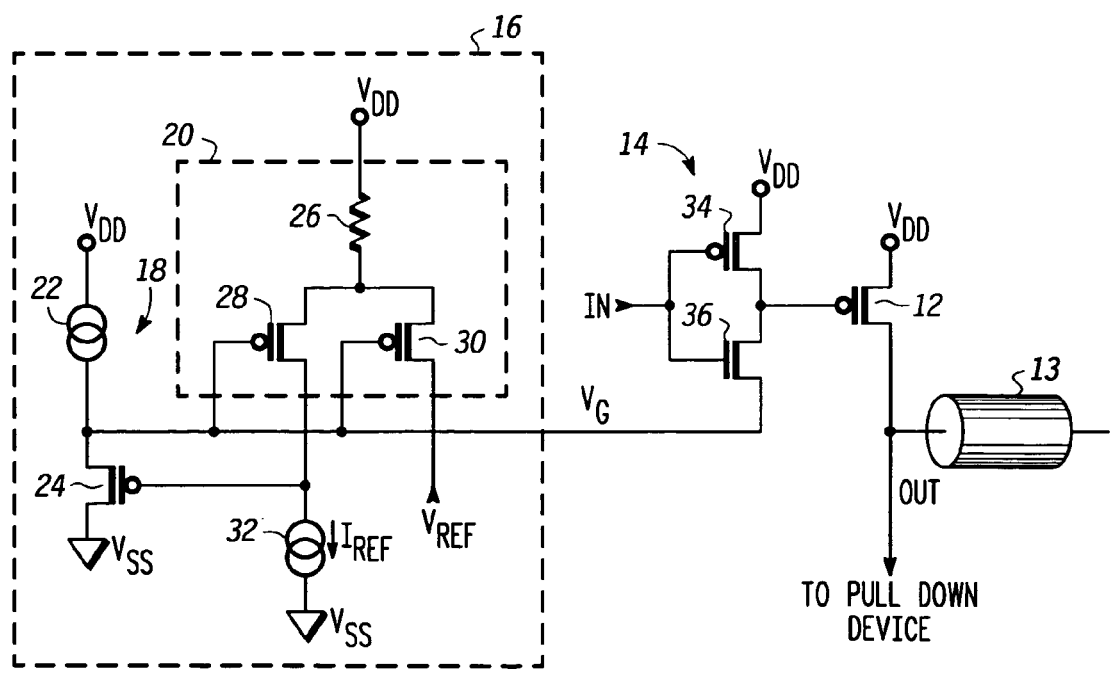
FIG. 2 illustrates, in schematic diagram form, an output buffer circuit in accordance with a second embodiment of the present invention.

FIG. 2 illustrates, in schematic diagram form, an output buffer circuit 40 in accordance with a second embodiment of the present invention. Note that for illustration purposes, like or similar elements in the various drawings are given the same reference number. Generally, output buffer circuit 40 is different from output buffer circuit 10 in that the feedback path from the drain of transistor 12 to the drain of transistor 30 has been removed and the reference voltage $V_{REF}$ is externally supplied.

In operation, the output impedance of the output buffer 40 of FIG. 2 is set by the voltage $V_{REF}$ as described above for the output buffer 10 of FIG. 1. Transistors 12 and 30 operate in the linear region and transistor 28 operates in saturation. The bias generator circuit 16 operates as described above and will not be repeated here. However, because $V_{REF}$ is not necessarily equal to voltage OUT in output buffer 40, the voltage $V_{REF}$ can be determined by applying the following equation:

$$G_{DS12} \approx k_{12}\{R_{26} \times I_{REF} + [1 + R_{26} \times k_{30} \times (V_{DD} - V_{REF})] \times (2I_{REF}/k_{28})^{0.5}\}$$

where k is $\sigma W/L$ for the subscripted reference number, and $R_{26}$ is the resistance of resistor 26. The symbol $\sigma$ represents the channel conductivity and is process dependent, W is the transistor gate width, and L is the transistor gate length.

The voltage $V_G$ is regulated by bias generator circuit 16. Because reference voltage $V_{REF}$ is provided externally and is relatively fixed, the voltage $V_G$ will vary more with changes in power supply voltage, temperature, and process than output buffer circuit 10. However, because output buffer 40 lacks the feedback path for providing $V_{REF}$, the circuit operation of output buffer 40 is relatively faster than that of output buffer 10.

Figure 3:
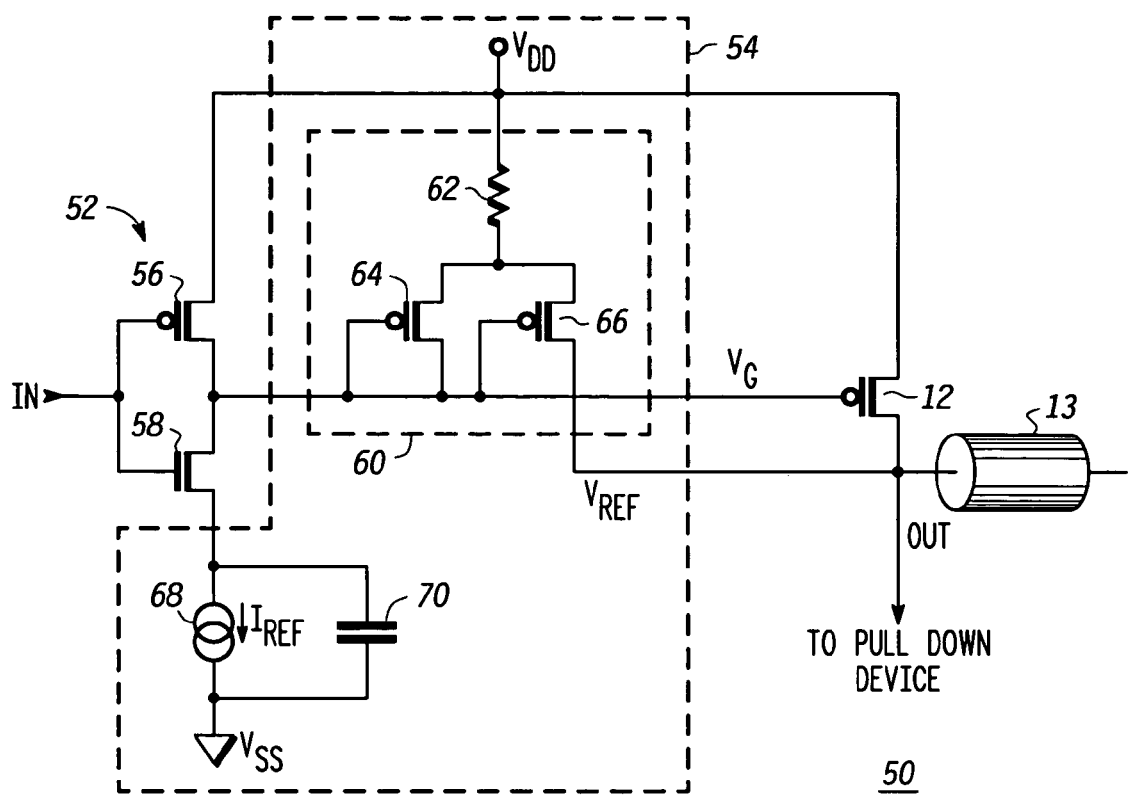
FIG. 3 illustrates, in schematic diagram form, an output buffer circuit in accordance with a third embodiment of the present invention.

FIG. 3 illustrates, in schematic diagram form, an output buffer circuit 50 in accordance with a third embodiment of the present invention. Output buffer circuit 50 includes output driver transistor 12, predriver circuit 52 and bias generator 54. Predriver circuit 52 comprises an inverter function and includes transistors 56 and 58. Bias generator 54 includes a resistance-to-voltage converter 60, a current source 68, and a capacitor 70. The resistance-to-voltage converter 60 includes resistor 62 and transistors 64 and 66. Transistors 56, 64, and 66 are P-channel MOS transistors and transistor 58 is an N-channel MOS transistor. Like the above two embodiments, transistor 66 is a substantially scaled replica of output transistor 12. Also like the embodiment of FIG. 1, a feedback path from the drain of transistor 12 to the drain of transistor 66 is used to provide the reference voltage VREF. However, unlike either of the above embodiments, output buffer circuit 50 has the bias generator circuit 54 coupled between the output of predriver circuit 52 and the gate of output driver transistor 12. Also, output buffer 50 lacks the unity gain amplifier present in the above embodiments.

In resistance-to-voltage converter 60, resistor 62 has a first terminal coupled to $V_{DD}$, and a second terminal. P-channel transistor 64 has a source coupled to the second terminal of resistor 62, and a gate and a drain both coupled to the output of predriver circuit 52. P-channel transistor 66 has a source coupled to the second terminal of resistor 62, a gate coupled to the output of predriver circuit 52, and a drain coupled to the drain of output driver transistor 12. The current source 68 has a first terminal coupled to the source of transistor 58, and a second terminal coupled to $V_{SS}$. The capacitor 70 has a first plate electrode coupled to the source of transistor 58, and a second plate electrode coupled to $V_{SS}$.

In operation, the input signal IN is generated by internal circuitry (not shown) and applied to the input of the predriver circuit 52. The output of the predriver circuit 52 controls the gate of the pull-up output driver transistor 12. As the output voltage of the predriver circuit 52 decreases, the conductivity of output driver transistor 12 increases causing the voltage of output signal OUT to increase. The output signal OUT is fed back to the drain of transistor 66 and used as the reference voltage ($V_{REF}$). The reference voltage $V_{REF}$ increases, causing the current through transistor 66 to decrease. The current through transistor 64 increases, causing the gate bias $V_G$ to transistor 12 to increase, thus making transistor 12 less conductive. When voltage $V_G$ is higher, the conductivity of the driver transistor 12 is reduced. When voltage $V_G$ is lowered, the conductivity of the output driver transistor 12 is increased. Capacitor 70 provides an initial discharge path to $V_G$, thus improving speed over the output buffer circuit 10.

Various changes and modifications to the embodiments herein chosen for purposes of illustration will readily occur to those skilled in the art. For example, variations in the types of conductivities of transistors, the types of transistors, etc. may be readily made. One skilled in the art will recognize that even though the embodiments of the present invention are directed to biasing a pull-up output driver device, the conductivity types of the transistors can be changed and the circuit schematic reversed to bias a pull-down output driver transistor. To the extent that such modifications and variations do not depart from the spirit of the invention, they are intended to be included within the scope thereof which is assessed only by a fair interpretation of the following claims.

What is claimed is:

1. An output buffer circuit comprising:
    an output driver transistor having a first current electrode coupled to a power supply voltage terminal, a control electrode, and a second current electrode for providing an output signal;
    a predriver circuit having an input terminal for receiving an input signal, a first terminal coupled to the power supply voltage terminal, a second terminal, and an output terminal coupled to the control electrode of the output driver transistor;
    a resistor having a first terminal coupled to the power supply voltage terminal, and a second terminal;
    a first transistor having a first current electrode coupled to the second terminal of the resistor, a control electrode coupled to the second terminal of the predriver circuit, and a second current electrode; and
    a second transistor having a first current electrode coupled to the second terminal of the resistor, a control electrode coupled to the second terminal of the predriver circuit, and a second current electrode.

2. The output buffer circuit of claim 1, wherein the output driver transistor is biased to operate in a linear region for matching a characteristic impedance of a transmission line coupled to the second current electrode of the output driver transistor.

3. The output buffer circuit of claim 1, wherein the predriver circuit comprises an inverter.

4. The output buffer circuit of claim 1, wherein the first transistor is for tracking a predetermined characteristic of the output driver transistor.

5. The output buffer circuit of claim 1, wherein the first transistor is substantially a scaled replica of the output driver transistor.

6. The output buffer circuit of claim 1, wherein the second current electrode of the first transistor is coupled to the second current electrode of the output driver transistor.

7. The output buffer circuit of claim 1, wherein the second current electrode of the first transistor is coupled to receive a reference voltage.

8. The output buffer circuit of claim 1, wherein the second current electrode of the second transistor is coupled to a current source.

9. The output buffer circuit of claim 1, wherein the second current electrode of the second transistor is coupled to the input terminal of the predriver circuit.

10. The output buffer circuit of claim 1, further comprising a unity gain amplifier having an output terminal coupled to the second terminal of the predriver circuit.

11. An output buffer circuit comprising:
    an output driver transistor having a first current electrode coupled to a power supply voltage terminal, a control electrode, and a second current electrode for providing an output signal;
    a predriver circuit having an input terminal for receiving an input signal, a first terminal coupled to the power supply voltage terminal, a second terminal, and an output terminal coupled to the control electrode of the output driver transistor; and
    a bias generator coupled to the second terminal of the predriver circuit, for providing a bias voltage to the second terminal of the predriver circuit for controlling the gate voltage of the output driver transistor, the bias generator comprising:
        a resistor having a first terminal coupled to the power supply voltage terminal, and a second terminal;
        a first transistor having a first current electrode coupled to the second terminal of the resistor, a control electrode coupled to the output terminal of the predriver circuit, and a second current electrode, wherein the first transistor is a substantially scaled replica of the output driver transistor; and
        a second transistor having a first current electrode coupled to the second terminal of the resistor, a control electrode coupled to the output terminal of the predriver circuit, and a second current electrode.

12. The output buffer circuit o claim 11, wherein the output driver transistor is biased to operate in an linear region for matching a characteristic impedance of a transmission line coupled to the second current electrode of the output driver transistor.

13. The output buffer circuit of claim 11, wherein the second current electrode of the first transistor is coupled to the second current electrode of the output driver transistor for feeding back the output signal to the bias generator.

14. The output buffer circuit of claim 11, wherein the second current electrode of the first transistor is coupled to receive a reference voltage.

15. The output buffer circuit of claim 11, wherein the second current electrode of the second transistor is coupled to the output terminal of the predriver circuit.

16. The output buffer circuit of claim 11, further comprising:
    a current source having a first terminal coupled to the second terminal of the predriver circuit, and a second terminal coupled to a second power supply voltage terminal; and
    a capacitive element having a first plate electrode coupled to the second terminal of the predriver circuit, and a second terminal coupled to the second power supply voltage terminal.

* * * * *